United States Patent [19]

Mitra et al.

[11] Patent Number: 5,112,764
[45] Date of Patent: May 12, 1992

[54] METHOD FOR THE FABRICATION OF LOW LEAKAGE POLYSILICON THIN FILM TRANSISTORS

[75] Inventors: Udayanath Mitra, Tarrytown; Mahalingam Venkatesan, Mohegan Lake, both of N.Y.

[73] Assignee: North American Philips Corporation, New York, N.Y.

[21] Appl. No.: 578,106

[22] Filed: Sep. 4, 1990

[51] Int. Cl.$^5$ ............................................. H01L 21/265
[52] U.S. Cl. ..................................... 437/40; 437/41; 437/44; 437/46; 437/909; 148/DIG. 150
[58] Field of Search .................. 437/40, 41, 44, 909; 357/23.7; 148/DIG. 150

[56] References Cited

U.S. PATENT DOCUMENTS

| | | | |
|---|---|---|---|
| 4,597,160 | 7/1986 | Ipri | 437/41 |
| 4,675,978 | 6/1987 | Swartz | 437/46 |
| 4,727,044 | 2/1988 | Yamazaki | 357/23.7 |
| 4,945,067 | 7/1990 | Huang | 357/23.7 |
| 5,006,479 | 4/1991 | Brandewie | 437/57 |
| 5,024,965 | 6/1991 | Chang et al. | 437/57 |

FOREIGN PATENT DOCUMENTS 0090683  3/1990  Japan ..................... 437/44

OTHER PUBLICATIONS

Nakazawa et al., "Lightly doped drain TFT structure for poly-si LCDs", Proc. of SID 1990, pp. 311-314.
Su, "Low-temperature silicon processing techniques for VLSIC fabrication", Solid State Tech., Mar. 1981, pp. 72-82.
Troxell et al., "Polycrystalline Silicon Thin-Film Transistors on a Novel 800° C. Glass Substrate", IEEE Elec. Dev. Lett., vol. EDL-7, No. 11, Nov. 1986, pp. 597-599.

Primary Examiner—Brian E. Hearn
Assistant Examiner—Tuan Nguyen
Attorney, Agent, or Firm—Norman N. Spain

[57] ABSTRACT

A method of manufacturing a thin film transistor having a low leakage current including depositing a layer of silicon oxide on a semiconductor substrate or on a layer of silicon nitrate deposited on a glass substrate, depositing a polysilicon layer, at a temperature of 520°-570° C., on the silicon oxide layer, annealing this polysilicon layer in a nitrogen atmosphere at a temperature of less than 650° C., forming islands in this polysilicon layer, forming a gate oxide layer on one of the islands by oxidizing the island under high pressure at a temperature below 650° C., forming a gate from a heavily doped polysilicon layer deposited on the gate oxide layer, forming lightly doped source and drain areas laterally adjacent to the gate, providing a thin layer of silicon oxide on the gate and the source and drain access, heavily doping areas of the first silicon layer adjacent to the source and drain areas, annealing the source and drain areas at a temperature below 650° C. and hydrogenating the resistive transistor with a hydrogen plasma.

13 Claims, 2 Drawing Sheets

METHOD FOR THE FABRICATION OF LOW LEAKAGE POLYSILICON THIN FILM TRANSISTORS

BACKGROUND OF THE INVENTION

The present invention relates to a method for producing polysilicon thin film transistors (TFT) which exhibit low reverse leakage under reverse bias conditions. The instant invention further is concerned with the fabrication of low leakage, high performance polysilicon thin film transistors in which fabrication temperatures that are employed are sufficiently low so as to allow the use of commercially available glass substrates.

As described in Ovshinsky et al, U.S. Pat. No. 4,843,443 thin film field effect transistors, are found to be particularly useful in electronic matrix arrays such as employed in liquid crystal displays and high density memories. When such transistors are employed in the liquid crystal displays, particularly for projection television systems, it is important that leakage current of these transistors be held to the minimum. It should be noted from U.S. Pat. No. 4,904,056 that leaking current causes the voltage stored in the liquid crystal capacitors employed in the liquid crystal matrix to change as a result of which display performance is degraded.

Tuan, U.S. Pat. No. 4,752,814, shows the use of a high voltage amorphous silicon thin film transistor, a gate and source electrode laterally displaced from a drain electrode for the use in amorphous silicon transistor switches employed for driving electrographic stylii. Here too, it is necessary that the reverse current flow of the transistor be minimized in order to prevent a breakdown of the transistor and an interrupt functioning of the stylii.

Fabrication of polysilicon thin film transistors generally requires the use of temperatures of as high as 1000° C. As a result, the use of expensive quartz substrates are required.

A thin film transistor fabricated at temperatures below 650° C., which allows the use of glass substrates, has been reported by H. Ohshima and S. Morozumi (IEDM proceedings, Washington, 1989 page 157). It has been found the characteristics of these devices are quite inferior when compared to the thin film transistors produced at high temperatures. In addition, these low temperature fabricated transistors found to exhibit relatively high leakage current.

Troxell et al, U.S. Pat. No. 4,851,363 shows a polysilicon thin film transistor as an alkaline earth alumino-silicate glass having a annealing point of approximately 800° C. Moreover the transistors made by the method of this patent do not exhibit any reduction in leakage current. Additionally during one stage of the method a temperature of at least 800° C. is employed, a temperature too high to allow use of many commercially available glasses.

Malhi et al, European Patent Specification 0129037 shows a method of reducing leakage current in thin film transistors by use of a hydrogen plasma treatment. While their technique reduces the leakage current flow a more significant decreased is desired, particularly for devices fabricated at low temperatures since low temperature fabrication leads to sharp (not well diffuse) junctions leading to higher electric fields and more leakage.

SUMMARY OF THE INVENTION

A principal object of the invention is to provide a method for manufacturing thin film transistors exhibiting a reduced leakage current. An additional object of the invention is to provide a method for manufacturing thin film transistors which exhibit a reduced leakage current and which employ inexpensive, commercially available, glass substrates having annealing points not significantly in excess of 650° C.

These and other objects of the invention will be apparent from the description that follows.

According to one aspect of the invention thin film transistors exhibiting a reduced reverse leakage current and employing a semiconductor substrate are manufactured according to a method which includes the following steps:

Depositing a relatively thick layer of silicon oxide on a semiconductor substrate by chemical vapor deposition, depositing a relatively thin polysilicon layer; at a temperature of 520°–570° C., on the relatively thick silicon oxide layer, annealing the relatively thin polysilicon layer at a temperature of less than 650° C. in a nitrogen atmosphere to cause large grain formation in this polysilicon layer, forming islands by etching the thin polysilicon layer, forming a thin gate oxide layer on at least one of the islands, depositing a relatively thick doped polysilicon layer on the gate oxide layer, forming a gate from the, relatively heavily doped, relatively thick polysilicon layer while having exposed laterally adjacent areas of the gate oxide layer and the underlying polysilicon island, lightly doping portions of the resultant exposed areas of the island of polysilicon laterally adjacent to the gate to form lightly doped source and drain areas, depositing a thin layer of silicon oxide on the gate and lightly doped source and drain areas, relatively heavily doping exposed areas of the layer of polysilicon laterally adjacent to the lightly doped source and drain areas to form relatively heavily doped source and drain areas, annealing the source and drain areas at a temperature of 600° C. to 750° C. and then hydrogenating the resultant device at a temperature of less than about a 400° C. with the hydrogen plasma.

According to an additional aspect of the invention, a glass substrate having a annealing point of not greater than about 650° C. is employed. In this aspect of the invention, the following additional steps is employed: a thin layer of an alkali-inert inorganic material is deposited on the glass substrate prior to the depositing of the first relatively thick layer of silicon oxide. This additional step is carried out at a temperature of less than 650° C.

DETAILED DESCRIPTION OF THE INVENTION

Figure 1A:
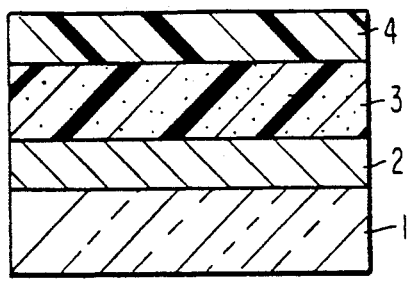
FIGS. 1a, 1b and 1c of the drawing are views in section, and not in scale, of several stages employed in the production of a thin film transistor according to the method of the invention.
Figure 1B:
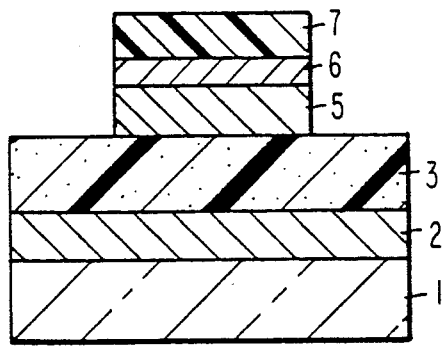
Figure 1C:
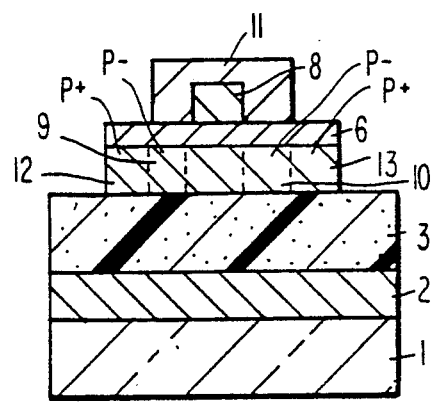

When the substrate is glass, preferably it is one having a annealing point of less than 650° C. However, other glass substrates may be employed.

Preferably, the method of the invention for manufacturing a thin film transistor employing a glass substrate embodies first depositing a thin layer of an alkali inert inorganic material on a glass substrate. This alkali inorganic material may, for example, be silicon nitride. However other alkali-inert inorganic materials may be employed such as silicon oxynitrides. The thickness of the layer of the alkali-inert inorganic material preferably is about 800–1200 Å. A relatively thick layer of silicon oxide is then deposited, by chemical vapor deposition, on the layer of alkali-inert inorganic material. A relatively thin polysilicon layer is then deposited at a temperature of 520° to 570° C. on the layer of silicon oxide. This thin polysilicon layer is then annealed at a temperature of less than 650° C. (preferably at a temperature of 580°–620° C.) in a nitrogen atmosphere.

Selected portions of this polysilicon layer are then removed by etching so as to form desired islands in this polysilicon layer and exposing selected areas of the silicon oxide layer. A thin gate oxide layer is then formed on these islands by oxidizing this island under a high pressure at a temperature below 650° C. Preferably a temperature range of 550° C.–650° C. and a pressure of 5–50 atmospheres is employed. A gate is then formed on the gate oxide layer by depositing a heavily doped polysilicon layer on the gate oxide layer and etching portions of this relatively heavily doped polysilicon layers to form the gates. The p or n dopants are implanted in areas of the islands of polysilicon slightly adjacent to the gates to form lightly doped source and drain areas.

A thin layer of silicon oxide, preferably 500 Å–50000 Å is then provided on the gate and on the adjacent doped source and drain areas by chemical vapor deposition. The layers of silicon adjacent to the relatively lightly doped source and drain areas are then heavily implanted with p or n dopants and annealed at a temperature below 650° C.

The resultant device is then hydrogenated at a temperature of less than about 400° C. with a hydrogen plasma. Preferably, hydrogenation is carried out at a temperature of 200° C.–450° C.

The relatively lightly doped source and drain areas may be provided with an implant dose of 0 to $5 \times 10^{13}$ atoms/cm$^2$ while the relatively heavily doped source and drain areas may be provided with an implant dose of $5 \times 10^{13}$–$5 \times 10^{15}$ atoms/cm$^2$. The doping concentration in the heavily doped gate may be from $10^{19}$ to $10^{21}$ atoms/cm$^3$.

As a dopant, source BF$_2$ may be employed; however, other possible doping sources such as B, P, as may also be employed. Doping may be carried out by ion implantation.

Preferably, the relatively thick layer of silicon oxide has a thickness of 15,000–25,000 Å, the relatively thin polysilicon layer has a thickness of 800–1700 Å and the relatively thin layer of silicon oxide has a thickness of about 800–1200 Å. Preferably, the relatively thick polysilicon layer has a thickness of 4000 Å–7000 Å.

When the substrate is relatively free of alkali, such as quartz, the layer of the alkali-inert inorganic material and the relatively thick silicon oxide layer may be omitted. The relatively thin polysilicon layer may then be deposited directly on the substrate.

EXAMPLE 1

On a cleaned glass wafer 1 a silicon nitride layer 2 of a thickness of about 1500 Å was deposited by an LPCVD process. A first relatively thick layer of silicon oxide 3 of a thickness of 2 microns was then deposited by a LPCVD process on the layer of silicon nitride. A relatively thin layer of polysilicon 4 was then deposited by a LPCVD process on a relatively thick layer 3 of silicon oxide. This layer 4 of silicon had a thickness of about 1500 Å. The polysilicon layer 4 was then annealed in a nitrogen atmosphere at a temperature of about 600° C. for about 48 hours.

The polysilicon layer 4 was then etched according to a desired pattern to form islands 5 from the polysilicon layer while leaving exposed portions of the silicon oxide layer 3.

A thin gate oxide layer 6 of a thickness of about 1000 Å was then formed on an island 5. A relatively thick polysilicon layer 7 of a thickness of about 5000 Å was then deposited on the gate oxide layer 6. The relatively thick polysilicon layer 7 was then heavily implanted with a boron difluoride implanter. The resulting dopant concentration was about $10^{20}$ to $10^{21}$ atoms/cm$^3$.

Portions of the heavily doped polysilicon layer 7 were then removed by reactive ion etching thereby producing a gate 8 and exposing areas of the gate oxide layer 6 and the underlying relatively thin polysilicon layer 5. Lightly doped source and drain areas 9 and 10 laterally adjacent to the gate 8 were then formed in the polysilicon layer 5 employing again a boron difluoride implanter and providing about $10^{12}$–$10^{13}$ atoms of boron difluoride (BF$_2$+) per cm$^2$.

A relatively thin layer of silicon oxide 11 of thickness about 3000 Å was then provided over the gate 8 and the lightly implanted source and drain areas 9 and 10. Relatively heavily doped source and drain areas 12 and 13 were formed in the areas of the polysilicon layer 5 laterally adjacent to the lightly doped source and drain areas 9 and 10 by doping the portions of the polysilicon layer 5 laterally adjacent to the lightly doped source and drain areas 9 and 10 by implanting boron with a dose of $10^{15}$ atoms of boron per cm$^2$.

The oxide layer 11 acts as an implant mask and prevents the lightly doped areas 9, 10 adjacent to the gate from getting heavily doped during the heavy implant.

The source and drain areas were then annealed at a temperature of about 650° C. in nitrogen for a period of about 10 hours.

The layers were then hydrogenated by use of a hydrogen plasma. Hydrogenation was carried out by the method described in the above-noted European Patent Specification 0129037. An anneal in the plasma discharge at a partial pressure of molecular hydrogen of 100 m torr for 120 minutes at a temperature of about 300° C. was employed.

EXAMPLE 2

A thin film transistor was made by a similar method except that a quartz substrate was employed and the first relatively thick layer of silicon oxide was deposited directly on the substrate, the deposition of the thin layer of inorganic material being omitted.

Figure 2:
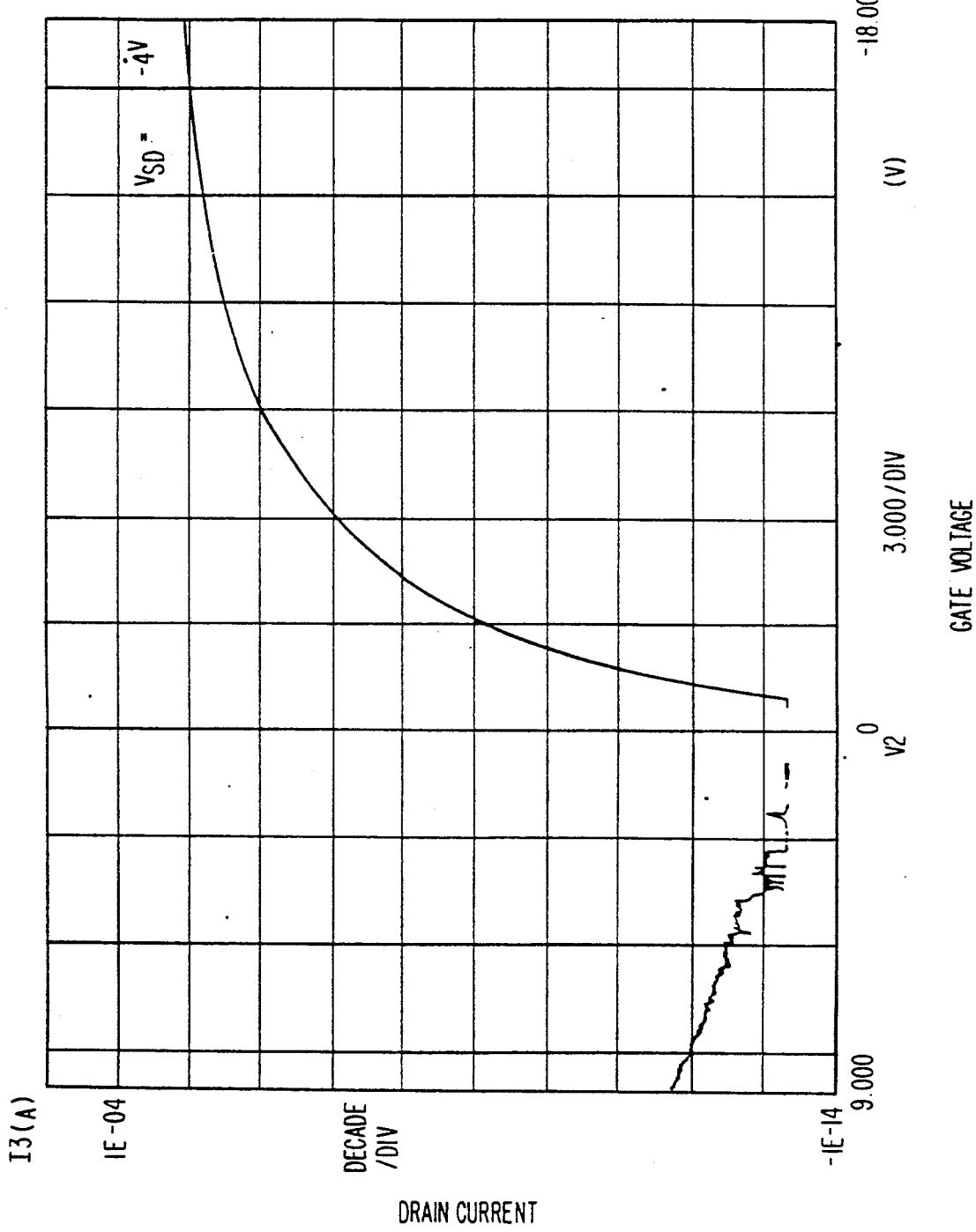
FIG. 2 is a graph showing the relationship between gate voltage and drain or leakage current of a thin film transistor of the invention.

The gate voltage and drain or leakage current of a thin film transistor produced according to Example 2 is shown in the graph of FIG. 2.

In this graph gate voltage (VG) is shown along the abscissa and drain or leakage current (ID) is shown along the ordinate.

The leakage current characteristics of a thin film transistor prepared according to the method of Example 2 in comparison to thin film transistors prepared by prior art methods is shown in the following table:

TABLE

| Source of Transistor | Minimum Leakage (pA/um) | Leakage at 5 V offset (pA/um) | Leakage at 10 V offset (PA/um) |
|---|---|---|---|
| Present Invention | 0.01 | 0.01 | 0.2 |
| T. Noguchi et al Proc. of MRS 1988 Vol. 106, p. 301 | 1.0 | 10.00 | 100.00 |
| K. Nakazawa et al Proc. of SID 1990, p. 311 | 0.30 | 0.50 | 1.0 |
| A. Mimura et al IEEE Trans on Elec. Dev. 1989, Vol. 36, No. 2, p. 351 | 1.0 | 1.0 | 5.0 |

In the examples in the table, leakage values are in picoamps per micron of gate width. The source to drain voltage was 5 volts for all these examples. The "offset" referred to in the table is rom the point of minimum leakage.

What is claimed is:

1. A low temperature method of manufacturing a thin film transistor having a low leakage current, said method comprising:
    a) depositing a thin layer of an alkali-inert inorganic material on a glass substrate having a annealing point less than 650° C.,
    b) depositing a first relatively thick layer of silicon oxide on the layer of inorganic material by chemical vapor deposition,
    c) depositing a relatively thin polysilicon layer, at a temperature of 520°-570° C., on the first layer of silicon oxide,
    d) annealing said relatively thin polysilicon layer at a temperature of less than 650° C. in a nitrogen atmosphere, to form a large grain polysilicon layer,
    e) etching said relatively thin polysilicon layer to remove portions of said polysilicon layer and expose selected areas of said first layer of silicon oxide and form islands in said polysilicon layer,
    f) oxidizing at least one of said islands under high pressure at a temperature below 650° C. to form a thin gate oxide layer on said island(s) of polysilicon,
    g) depositing a relatively thick, heavily doped polysilicon layer on said gate oxide layer and etching away portions of said relatively heavily doped polysilicon layer to form a gate,
    h) relatively lightly implanting p or n dopants in areas of said island of polysilicon laterally adjacent to said gate to form lightly doped source and drain areas,
    i) providing by chemical vapor deposition a second relatively thin layer of silicon oxide on said gate and on adjacent lightly doped source and drain areas,
    j) relatively heavily doping areas of said first layer of silicon adjacent to said relatively lightly doped source and drain areas,
    k) annealing said source and drain areas at a temperature below 650° C., and
    l) hydrogenating the resultant device at a temperature of 200°-400° C. with a hydrogen plasma.

2. The method of claim 1 wherein the alkali-inert inorganic material is silicon nitride.

3. The method of claim 2 wherein the substrate has a annealing point of about 550°-650° C.

4. The method of claim 3 wherein said relatively thick polysilicon layer is annealed at a temperature of 580°-620° C.

5. The method of claim 4 wherein the gate oxide layer is formed by heating the island at 550°-650° C. at a pressure of 5-50 atmospheres.

6. The method of claim 5 wherein the thin layer of silicon nitride has a thickness of 800-1200 Å and the relatively thick silicon oxide layer has a thickness of 17,000-23,000 Å.

7. The method of claim 2 wherein the first, relatively thick, layer of silicon oxide is deposited by chemical vapor deposition.

8. The method of claim 1 wherein the first, relatively thick, layer of silicon oxide is deposited by chemical vapor deposition.

9. A method of manufacturing a thin film transistor exhibiting a reduced reverse leakage current, said method comprising:
    a) forming a first relatively thick layer of silicon oxide on a semiconductor substrate,
    b) depositing a first relatively thin polysilicon layer at a temperature of less than 650° C. on said first layer of silicon oxide,
    c) annealing said relatively thin polysilicon layer in a nitrogen atmosphere,
    d) removing, by etching, selective portions of said first relatively thin polysilicon layer to expose selective portions of said first layer of silicon oxide and forming islands in said first relatively thin polysilicon layer,
    e) oxidizing at least one of said islands under high pressure at a temperature below about 650° C. to form a thin gate oxide layer on said island(s) of said relatively thin polysilicon layer,
    f) depositing a second relatively thick polysilicon layer on said gate oxide layer,
    g) heavily doping said second polysilicon layer and etching away, by reactive ion etching, portions of the resultant doped second polysilicon layer to form a gate,
    h) relatively lightly doping resultant exposed areas of said island of said first layer of polysilicon laterally adjacent to said gate to form lightly doped source and drain areas,
    i) providing a relatively thin, layer of silicon oxide on said gate and on said adjacent lightly doped source and drain areas,
    j) relatively heavily doping exposed areas of said island of said layer of polysilicon adjacent to said first lightly doped source and drain areas to form relatively heavily doped source and drain areas,
    k) annealing said source and drain areas at a temperature of 600°-750° C., and
    l) hydrogenating the resultant device at a temperature of less than about 400° C. with a hydrogen plasma.

10. The method of claim 9 wherein said high pressure oxidation of said island is carried out at a temperature of 550°-650° C. under a pressure of 5-50 atmospheres.

11. The method of claim 10 wherein the device is hydrogenated at 200°-450° C.

12. The method of claim 11 wherein the second polysilicon layer is doped with $BF_3$.

13. The method of claim 11 wherein said first polysilicon layer has a thickness of about 500 Å to 1500 Å and said second polysilicon layer has a thickness of about 4000 Å to 7000 Å.

* * * * *